United States Patent
Baldwin et al.

(10) Patent No.: US 6,608,755 B2
(45) Date of Patent: Aug. 19, 2003

(54) ADAPTER WHICH IS ADAPTED TO RECEIVE CARDS DESIGNED FOR A DIFFERENT FORM FACTOR

(75) Inventors: Richard Baldwin, Austin, TX (US); Seth Cunningham, Austin, TX (US); Alvin Becker, Austin, TX (US)

(73) Assignee: National Instruments Corporation, Austin, TX (US)

( * ) Notice: Subject to any disclaimer, the term of this patent is extended or adjusted under 35 U.S.C. 154(b) by 0 days.

(21) Appl. No.: 10/084,246

(22) Filed: Feb. 27, 2002

(65) Prior Publication Data

US 2002/0135987 A1 Sep. 26, 2002

Related U.S. Application Data

(60) Provisional application No. 60/272,003, filed on Feb. 27, 2001.

(51) Int. Cl.$^7$ .................................................. H05K 7/00
(52) U.S. Cl. ............................ 361/729; 361/784; 439/62
(58) Field of Search ................................. 361/728–732, 361/784, 788, 790, 792, 801, 802, 807, 825; 439/61, 62, 64, 65, 74, 325, 631, 374, 377

(56) References Cited

U.S. PATENT DOCUMENTS

| | | | |
|---|---|---|---|
| 5,448,699 A | * | 9/1995 | Goss et al. ................. 710/301 |
| 5,648,891 A | * | 7/1997 | Gierut ......................... 361/788 |
| 6,038,138 A | * | 3/2000 | Dayton et al. ............... 361/796 |
| 6,075,704 A | * | 6/2000 | Amberg et al. .............. 361/736 |
| 6,195,262 B1 | | 2/2001 | Bodette et al. |
| 6,198,633 B1 | | 3/2001 | Lehman et al. |
| 6,422,876 B1 | * | 7/2002 | Fitzgerald et al. ............ 439/61 |

OTHER PUBLICATIONS

Rittal Product Sheet for Ripac "Perfect Handling" pp. 17–26. Undated; contains products referenced in the background section of the application.

* cited by examiner

Primary Examiner—David Martin
Assistant Examiner—Thanh S. Phan
(74) Attorney, Agent, or Firm—Meyertons Hood Kivlin Kowert & Goetzel, P.C.; Jeffrey C. Hood (57) ABSTRACT

The coupling apparatus couples two cards of a first size to fit in to a chassis having slots of second size. The coupling apparatus can connect two 3U cards together by clamping the first card and the second card between a first plate and a second plate to effectively form a combined card of a second size. Thus two 3U cards can be connected together and inserted into a 6U slot in a 6U chassis.

24 Claims, 10 Drawing Sheets

ADAPTER WHICH IS ADAPTED TO RECEIVE CARDS DESIGNED FOR A DIFFERENT FORM FACTOR

PRIORITY CLAIM

This application claims benefit of priority of U.S. provisional application Serial No. 60/272,003 titled "3U—3U ADAPTER FOR ANY 6U PXI/CPCI COMPLIANT CHASSIS" filed Feb. 27, 2001, whose inventor is Richard Baldwin.

FIELD OF THE INVENTION

The present invention relates to an adapter for coupling two cards of one size to create a combined card of a second size, and more specifically to create a combined card in a CompactPCI/PXI form factor.

DESCRIPTION OF THE RELATED ART

An instrument is a device which collects data or information from an environment or unit under test and displays this information to a user. An instrument may also perform various data analysis and data processing on acquired data prior to displaying the data to the user. Examples of various types of instruments include oscilloscopes, digital multimeters, pressure sensors, etc., and the types of information which might be collected by respective instruments include voltage, resistance, distance, velocity, pressure, frequency of oscillation, humidity or temperature, among others.

The various hardware interface options currently available for instrumentation systems can be categorized into various types, including IEEE 488-controlled instruments (GPIB instruments), VXI bus instruments, PXI bus instruments, plug-in data acquisition (DAQ) boards, and RS-232-controlled (serial) instruments, among others.

The PXI (PCI eXtensions for Instrumentation) bus is a platform for instrumentation systems that was introduced in 1997. PXI combines the high-speed PCI bus with integrated timing and triggering designed specifically for measurement and automation applications to deliver significant performance improvements over older architectures. PXI is built on the modular and scalable CompactPCI specification and the high-speed PCI bus architecture. As a result, PXI products maintain complete interoperability with CompactPCI, offering superior mechanical integrity, easy systems integration, and more expansion slots than desktop computers.

Figure 1:
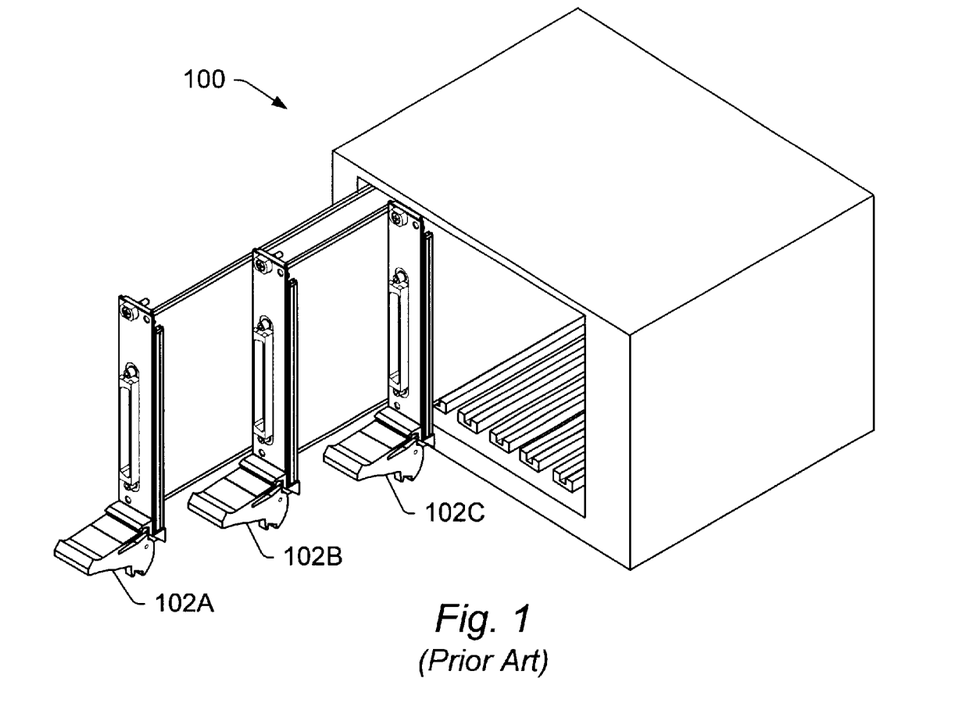
FIG. 1 illustrates a prior art chassis of VXI/VME/CompactPCI/PXI type.

FIG. 1 (Related Art) Exemplary Chassis

FIG. 1 illustrates an exemplary chassis of either VXI, VME, CompactPCI, or PXI type. Cards 102A, 102B, and 102C are designed to physically connect with the chassis backplane (not shown). The chassis 100 comprises a housing which is configured to define a plurality of slots. The backplane is comprised in the housing and is adapted for transmitting electrical signals. Cards 102A, 102B, and 102C can be of either 3U or 6U size, such as described below with reference to FIG. 2.

Figure 2:
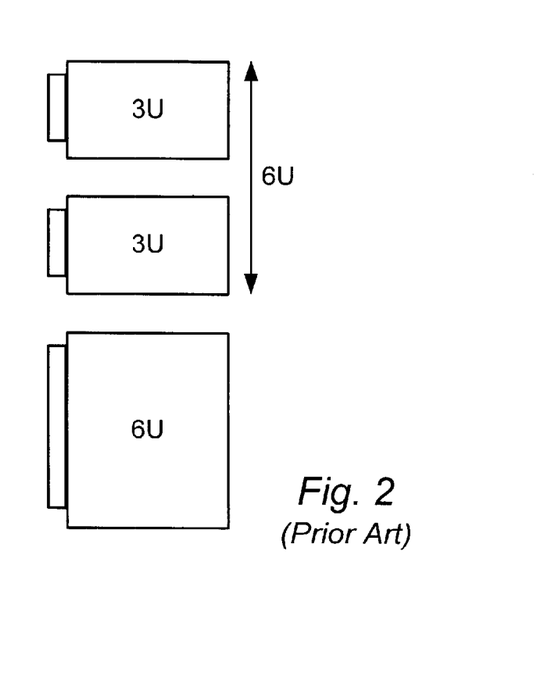
FIG. 2 illustrates prior art various card formats.

FIG. 2 (Related Art) Various Card Formats

FIG. 2 illustrates different card formats as defined by the IEEE 1101.10, CompactPCI, and PXI specifications. The IEEE 1101.10, CompactPCI, and PXI specifications define two card sizes, referred to as 3U and 6U, and two chassis sizes, referred to as 3U and 6U, designed to accept 3U and 6U cards, respectively. The IEEE 1101.10, CompactPCI, and PXI specification define 6U card size to be more than twice as tall as the 3U card size.

Since there are two chassis sizes and two card sizes, it would be advantageous to allow 3U cards to fit into a 6U chassis. Related art such as Front Panel Adapter, PN# 3687098 and PN# 3687471 from Rittal allow users to connect two 3U cards into a single 6U slot in a 6U chassis. However, Rittal and related solutions may require a pre-defined set of mounting holes on the cards 102A, 102B, and 102C in order to use the adapter. The pre-defined holes may not be universal to all CompactPCI cards 102A, 102B, and 102C, thus making the adapter difficult to utilize properly. Other related art includes solutions for a 6U chassis with a pre-defined number of 3U slots, such as products from Adlink, Ziatech, and Diversified Technologies.

However, a flexible solution is desired which will ease the installation of two 3U cards in any single 6U slot in a 6U chassis, and which will accept any CompactPCI card.

SUMMARY OF THE INVENTION

One embodiment of the present invention comprises an adapter which can couple two 3U cards to fit a single 6U slot in a 6U chassis. The apparatus is operable to couple a first module to a second module to form a combined module. The apparatus comprises a first plate and a second plate, coupled together by one or more coupling elements.

In one embodiment, the method comprises positioning the first plate to physically contact an upper portion of the first side of the first module and a lower portion of the first side of the second module. The first plate has an interior side and an exterior side. A lower portion of the interior side of the first plate is operable to contact the upper portion of the first side of the first module, and an upper portion of the interior side of the first plate is operable to contact the lower portion of the first side of the second module.

The method may also comprise positioning the second plate to physically contact an upper portion of the second side of the first module and a lower portion of the second side of the second module. The second plate also has an interior side and an exterior side. A lower portion of the interior side of the second plate is operable to contact the upper portion of the second side of the first module, and an upper portion of the interior side of the second plate is operable to contact the lower portion of the second side of the second module.

The method may then comprise applying one or more coupling elements operable to couple the first plate to the second plate. This operates to clamp the upper portions of the first side and the second side of the first module between a lower portion of the first plate and a lower portion of the second plate. This also further operates to clamp the lower portions of the first side and the second side of the second module between an upper portion of the first plate and an upper portion of the second plate. This further operates to clamp the first plate and the second plate together, thereby coupling the first module to the second module to form a combined module of a second size.

BRIEF DESCRIPTION OF THE DRAWINGS

A better understanding of the present invention can be obtained when the following detailed description of the preferred embodiment is considered in conjunction with the following drawings, in which.

Although the system and method of the present invention has been described in connection with the preferred embodiment, it is not intended to be limited to the specific form set forth herein, but on the contrary, it is intended to cover such alternatives, modifications, and equivalents, as can be reasonably included within the spirit and scope of the invention as defined by the appended claims.

DETAILED DESCRIPTION OF THE PREFERRED EMBODIMENT

Incorporation by Reference

U.S. patent application Ser. No. 5,995,376 titled "Chassis which includes configurable slot 0 locations" filed May 20, 1997, is hereby incorporated by reference as though fully and completely set forth herein.

U.S. patent application Ser. No. 6,198,633 B1 titled "Computer system and enclosure thereof" filed Jul. 17, 1998, is hereby incorporated by reference as though fully and completely set forth herein.

Figure 3A:
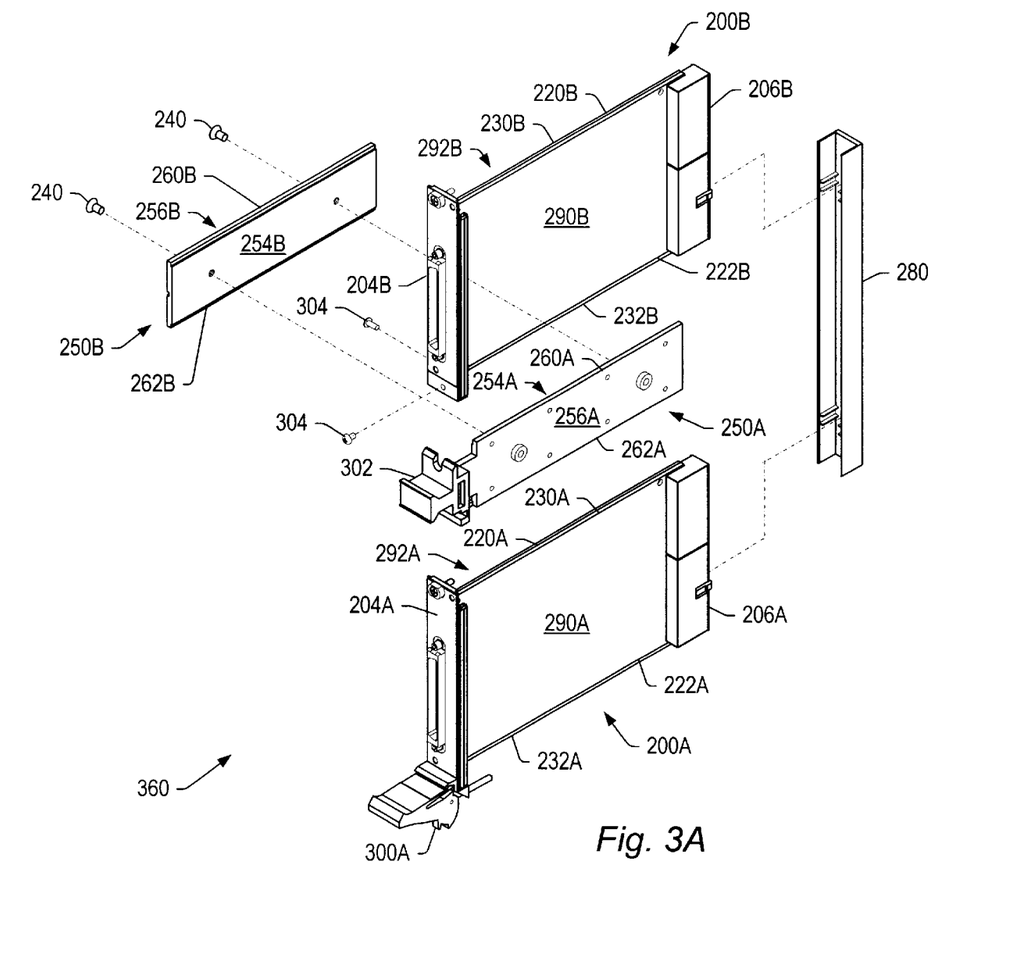
FIGS. 3A and 3B illustrate exemplary embodiments of the apparatus, according to one embodiment.
Figure 3B:
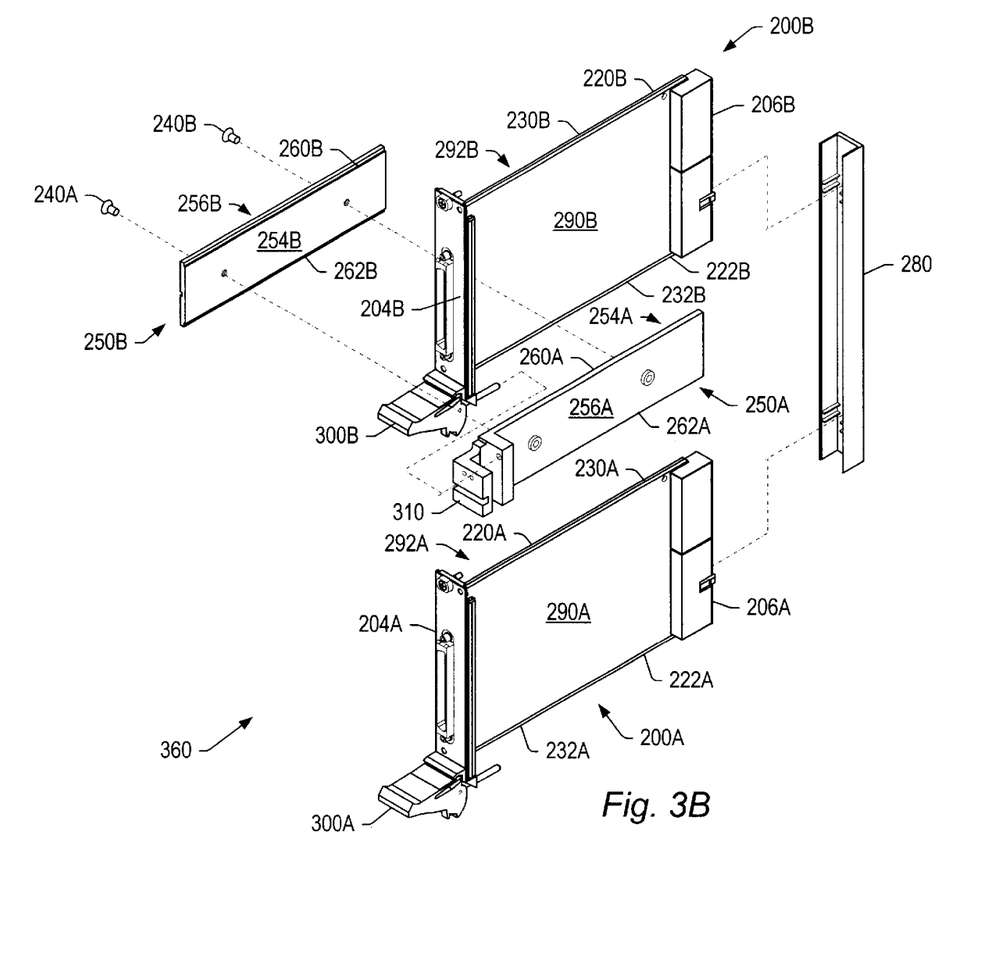
Figure 4A:
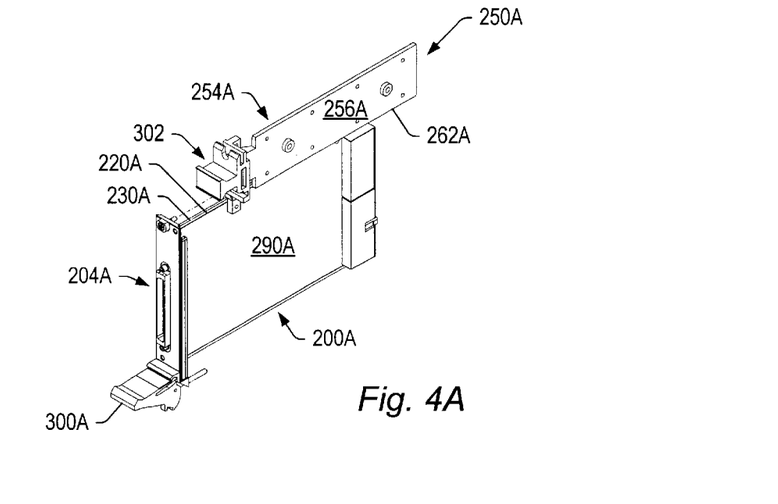
FIGS. 4A–4E illustrate a method for coupling first module to second module, according to one embodiment.
Figure 4B:
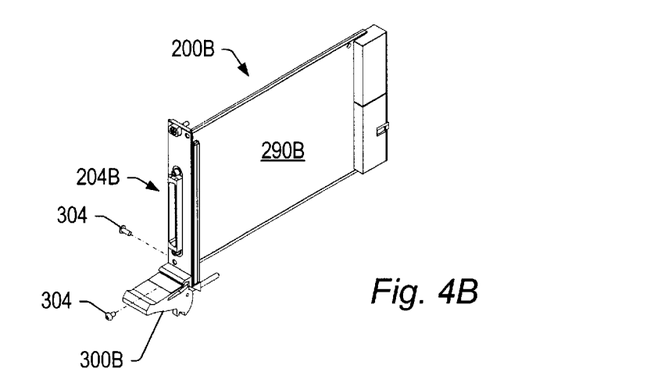
Figure 4C:
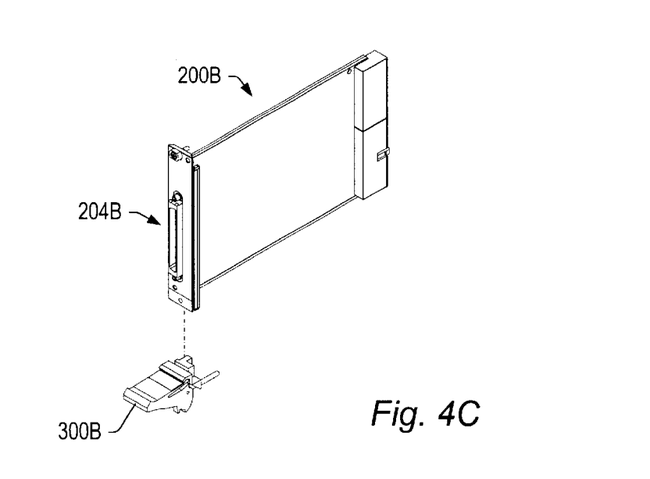
Figure 4D:
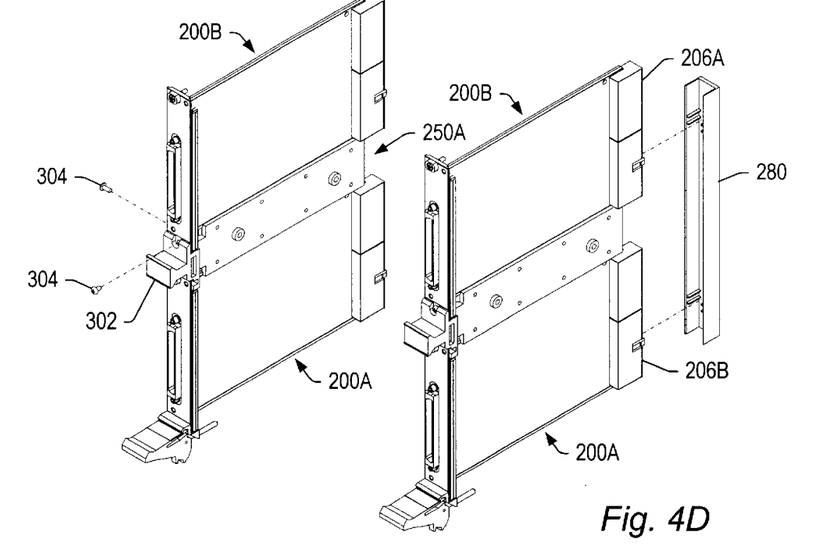
Figure 4E:
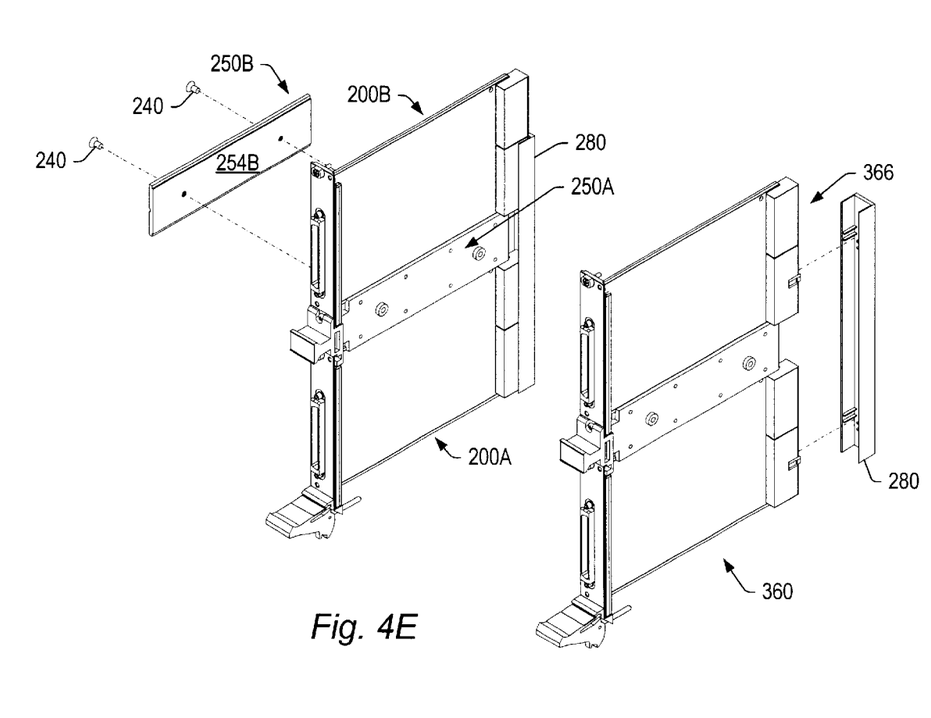
Figure 5A:
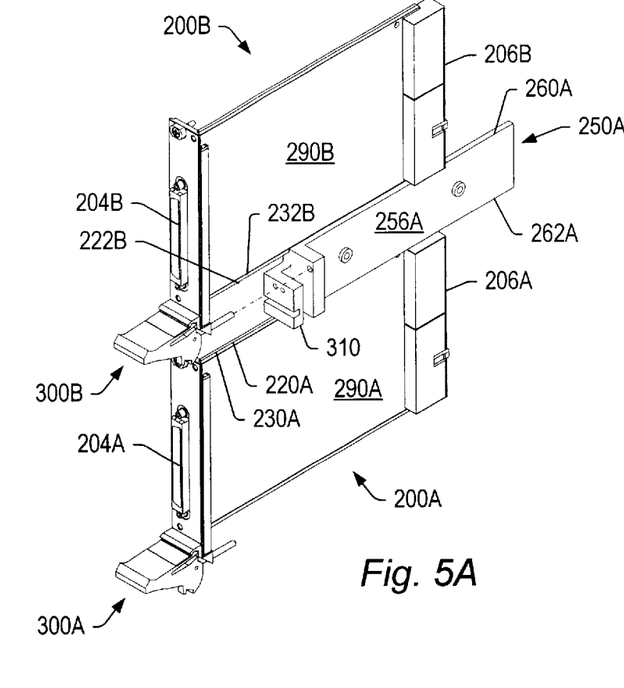
FIGS. 5A–5D illustrate another method for coupling first module to second module, according to one embodiment.
Figure 5B:
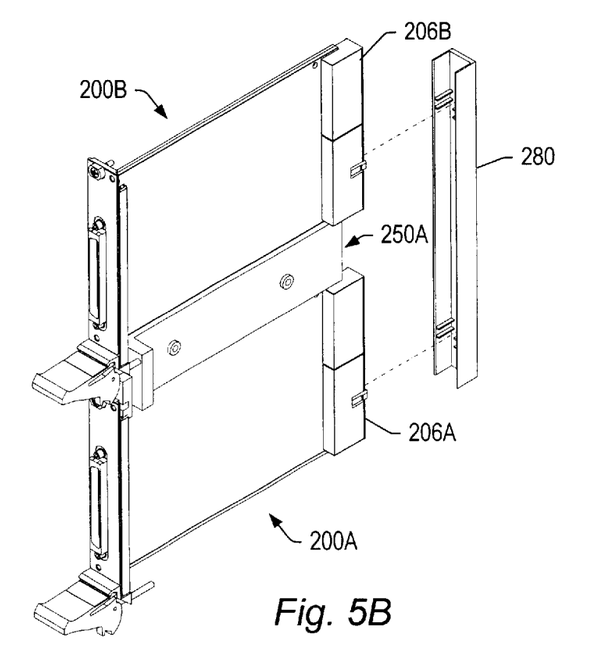
Figure 5C:
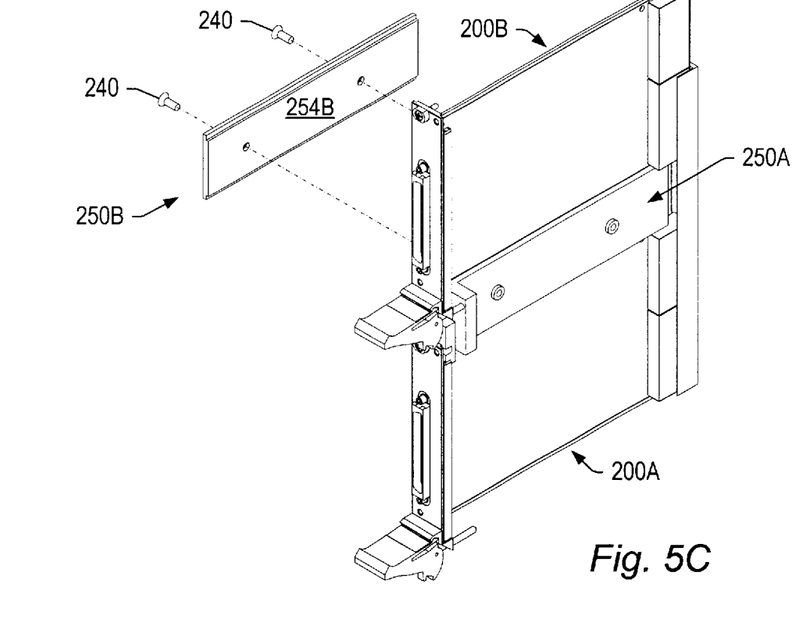
Figure 5D:
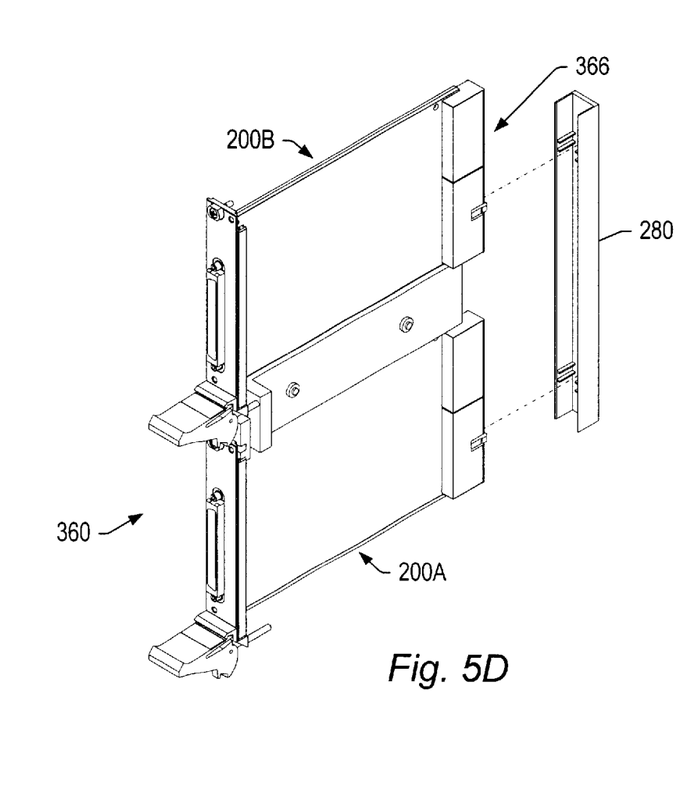

FIGS. 3A and 3B—Exemplary Embodiments of the Apparatus

FIGS. 3A and 3B illustrate exemplary embodiments of an apparatus for coupling a first module 200A to a second module 200B to form a combined module 360. The apparatus comprises a first plate 250A and a second plate 250B, coupled together by one or more coupling elements 240. FIGS. 3A and 3B are exploded views to illustrate the various components.

In one embodiment, the first module 200A and the second module 200B each comprises a front face 204A and 204B respectively, a back face 206A and 206B respectively, opposite to the front face 204A and 204B respectively. Each back face 206 comprises one or more connectors for coupling to a chassis 100. The first module 200A and the second module 200B each comprises a first lateral edge 220A and 220B respectively. The first lateral edge 220A and 220B each comprises a first keep-out region 230A and 230B respectively which extends at least a portion of the distance from the front face 204A and 204B to the back face 206A and 206B, respectively.

The first module 200A and the second module 200B each comprises a second lateral edge 222A and 222B respectively. The second lateral edge 222A and 222B is located opposite to the first lateral edge 220A and 220B respectively. The second lateral edge 222A and 222B each comprises a second keep-out region 232A and 232B respectively, which extends at least a portion of the distance from the front face 204A and 204B to the back face 206A and 206B, respectively.

In one embodiment, each of the first module 200A and the second module 200B has a first size. In one embodiment, the first size may be referred to as 3U.

In one embodiment, the apparatus may comprise a first plate 250A and a second plate 250B, and one or more coupling elements 240 operable to couple the first plate 250A to the second plate 250B. In one embodiment, the first plate 250A and the second plate 250B each may comprise a first lateral edge 260A and 260B respectively, and a second lateral edge 262A and 262B respectively opposite to the first lateral edge 260A and 260B respectively.

In one embodiment, in coupling the first plate 250A to the second plate 250B, the one or more coupling elements 240 are operable to clamp the first keep-out region 230A of the first module 200A between the second lateral edge 262A of the first plate 250A and the second lateral edge 262B of the second plate 250B, and to clamp the second keep-out region 232B of the second module 200B between the first lateral edge 260A of the first plate 250A and the first lateral edge 260B of the second plate 250B, thereby coupling the first module 200A to the second module 200B to form a combined module 360 of a second size.

In one embodiment, the combined module 360 is operable to be inserted into a slot in the chassis 100, wherein the chassis 100 comprises one or more slots each operable to receive a module 360 of the second size.

In one embodiment, the first size comprises a first height, wherein the front face 204A and the back face 206A of the first module 200A and the second module 200B each has the first height. The second size comprises a second height, which is at least twice the first height. In one embodiment, the first height is approximately 3U, and the second height is approximately 6U.

In one embodiment, the combined module 360 comprises a back face 366, wherein the back face 366 of the combined module 360 comprises one or more connectors for coupling to a chassis 100. The combined module 360 may comprise the back face 206A of the first module 200A and the back face 206B of the second module 200B.

In one embodiment, a card alignment guide 280 is operable to physically removably connect to the back face 206A of the first module 200A and to the back face 206B of the second module 200B to align the first module 200A and the second module 200B. The card alignment guide 280 may be used to position and align the first module 200A and the second module 200B while the apparatus is being applied to couple the first module 200A and the second module 200B together. In one embodiment, the card alignment guide 280 is operable to be removed from the back face 366 of the combined module 360 after the apparatus has been fixedly coupled to the first module 200A and the second module 200B.

When the combined module 360 is inserted into a slot in the chassis 100, the one or more connectors on each of the first module 200A and the second module 200B may be adapted to connect to corresponding connectors in the chassis 100.

In one embodiment, the first module 200A and the second module 200B comprise at least one injector/ejector lever 300A, 300B. The injector/ejector lever 300A, 300B is operable to inject/eject a module 200A, 200B, and 360 into/out of a chassis 100.

In one embodiment, the first plate 250A may comprise a handle element 302. The handle element 302 may couple to the second module 200B. Referring now to FIG. 3B, in another embodiment, the first plate 250A may comprise a lever mounting element 310. The lever mounting element 310 may couple to the second module 200B.

FIGS. 4A–4E and 5A–5D—Exemplary Methods for Coupling First Module to Second Module FIGS. 4A–4E and FIGS. 5A–5D illustrate exemplary methods for coupling the adapter to the first module 200A and to the second module 200B. The first module 200A and the second module 200B each comprise a first side 290A and 290B respectively, and a second opposite side 292A and 292B respectively.

In one embodiment, the method comprises positioning the first plate 250A to physically contact an upper portion of the first side 290A of the first module 200A and a lower portion of the first side 290B of the second module 200B. The first plate 250A has an interior side 254A and an exterior side 256A. In one embodiment, a lower portion of the interior side 254A of the first plate is operable to contact the upper portion of the first side 290A of the first module 200A. In addition, an upper portion of the interior side 254A of the first plate 250A is operable to contact the lower portion of the first side 290B of the second module 200B.

In one embodiment, the method comprises positioning the second plate 250B to physically contact an upper portion of the second side 292A of the first module 200A and a lower portion of the second side 292B of the second module 200B. The second plate 250B has an interior side 254B and an exterior side 256B. In one embodiment, a lower portion of the interior side 254B of the second plate 250B is operable to contact the upper portion of the second side 292A of the first module 200A. In addition, an upper portion of the interior side 254B of the second plate 250B is operable to contact the lower portion of the second side 292B of the second module 200B.

In one embodiment, the method comprises applying one or more coupling elements 240 operable to couple the first plate 250A to the second plate 250B. In one embodiment, the coupling elements 240 operate to clamp the upper portions of the first side 290A and the second side 292A of the first module 200A between the lower portion of the first plate 250A and the lower portion of the second plate 250B. The coupling elements 240 further operate to clamp the lower portions of the first side 290B and the second side 292B of the second module 200B between an upper portion of the first plate 250A and an upper portion of the second plate 250B. The coupling elements 240 further operate to clamp the first plate 250A and the second plate 250B together, thereby coupling the first module 200A to the second module 200B to form a combined module 360 of a second size.

The combined module 360 may then be inserted into a slot in the chassis 100, wherein the chassis 100 comprises one or more slots each operable to receive a module of the second size.

In one embodiment, the adapter may be coupled with the first module 200A and the second module 200B simultaneously. The adapter may be coupled with the first module 200A first, then the second module 200B. Alternatively, the adapter may be coupled with the second module 200B first, then the first module 200A.

In one embodiment, the injector/ejector lever 300B may be removed from the second module 200B. In one embodiment, the handle 302 on the first plate 250A may be coupled to the second module 200B. In another embodiment, the lever mounting element 310 may be coupled to the second module 200B.

Figure 6A:
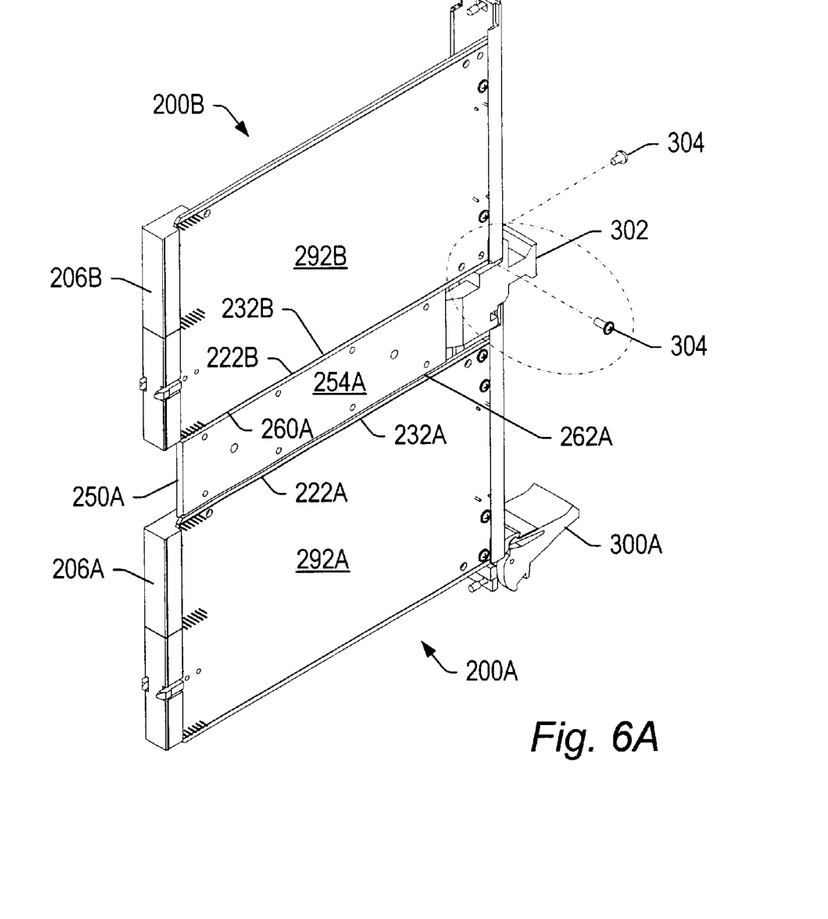
FIGS. 6A–6B illustrate a method for coupling a first plate to the second module, according to one embodiment.
Figure 6B:
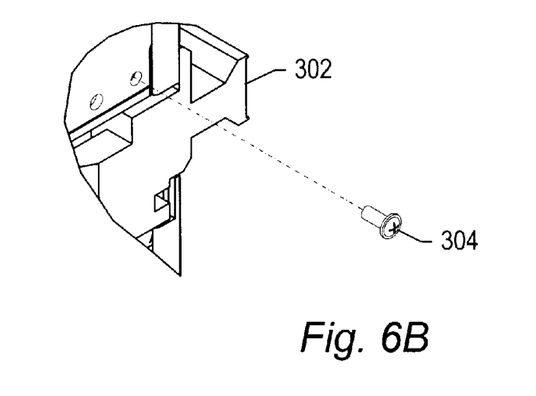

FIGS. 6A–6B—Exemplary Method for Coupling a First Plate to the Second Module FIG. 6A illustrates an exemplary method for coupling the first plate 250A to the second module 200B, according to one embodiment. FIG. 6B illustrates a detailed coupling operation, where a coupling element 304 is used to couple the first plate 250A to the second module 200B. In one embodiment, the first plate 250A comprises the handle element 302.

Figure 7A:
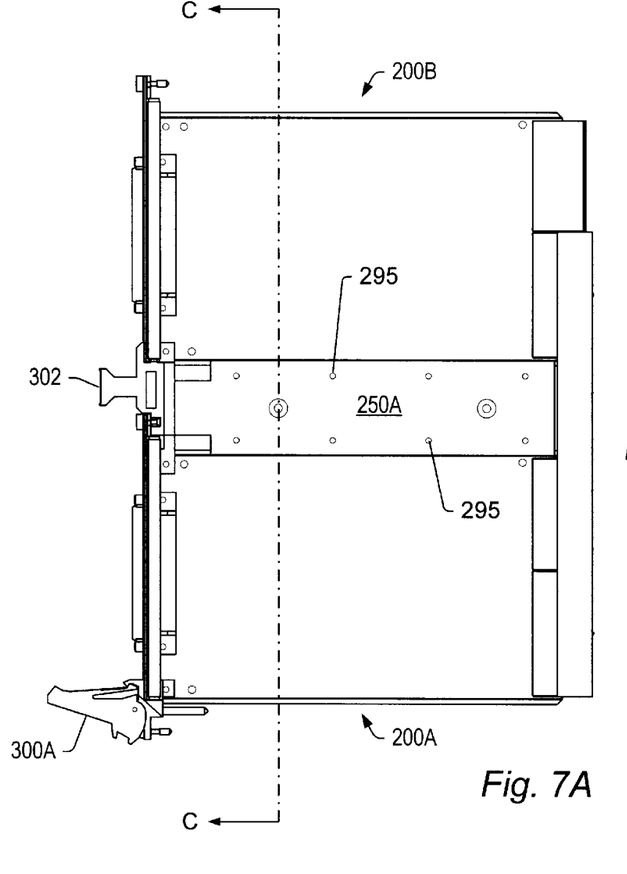
FIGS. 7A–7C illustrate outside step-down regions, according to one embodiment.
Figure 7B:
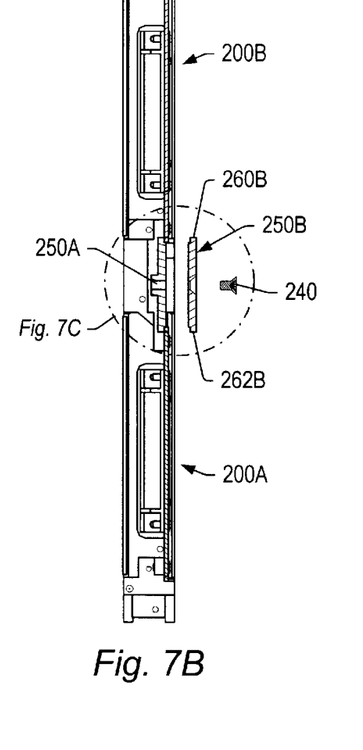
Figure 7C:
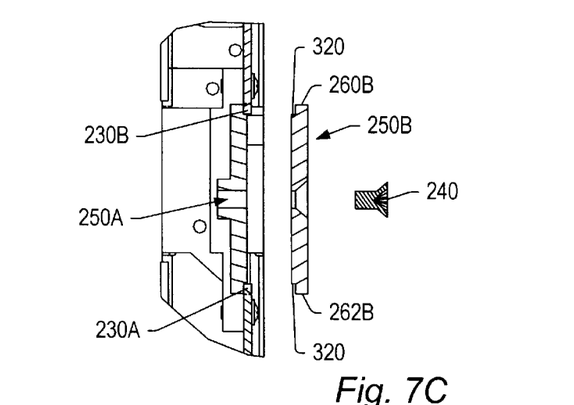

FIGS. 7A–7C—Exemplary Embodiments of Outside Step-Down Regions

FIGS. 7A–7C illustrate exemplary embodiments of outside step-down regions. In one embodiment, at least one of the first plate 250A and the second plate 250B further comprises the outside step-down region 320. Prior to clamping first plate 250A and second plate 250B together, the outside step-down region may be operable to provide guide rail functionality for the keep out region 232A and 232B of each of the first module 200A and the second module 200B during coupling. FIG. 7A shows the combined module 360 as viewed from the side, and FIGS. 7B and 7C show the combined module 360 as viewed from the back.

In one embodiment, at least one of the first plate 250A and the second plate 250B further comprises one or more mounting holes 295 operable to couple with air flow deflectors (not shown).

FIGS. 8A–8D—Exemplary Embodiments of Coupling Apparatus

Figure 8A:
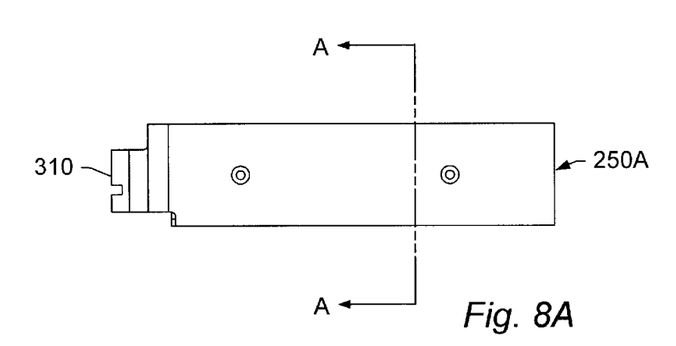
FIGS. 8A–8D illustrate exemplary embodiments of the coupling apparatus, according to one embodiment.
Figure 8B:
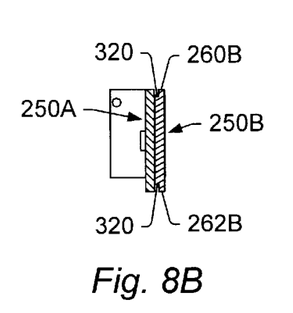

FIGS. 8A–8D illustrate exemplary embodiments of the coupling apparatus. FIG. 8A shows the coupling apparatus as viewed from the side, and FIG. 8B shows the coupling apparatus as viewed from the back. In one embodiment, as illustrated by FIGS. 8A and 8B, the second plate 250B comprises two outside step-down regions 320.

Figure 8C:
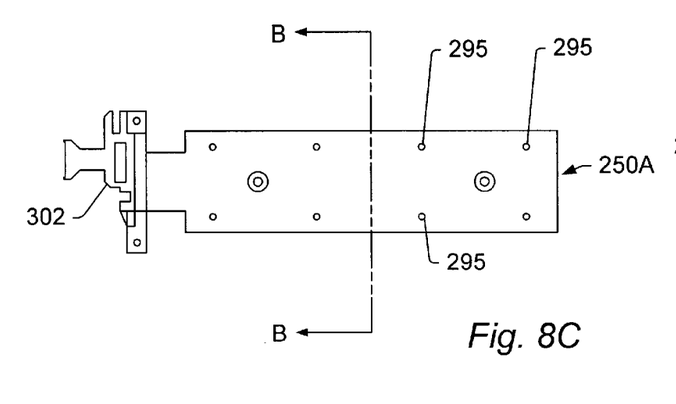
Figure 8D:
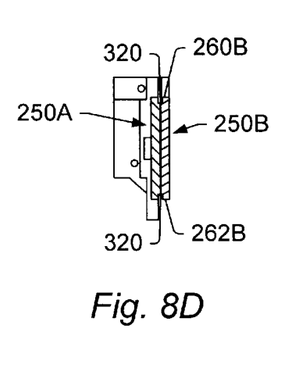

In another embodiment, as illustrated by FIGS. 8C and 8D, the first plate 250A and the second plate 250B each comprises two outside step-down regions 320. FIG. 8C shows the coupling apparatus as viewed from the side, and FIG. 8D shows the coupling apparatus as viewed from the back.

In one embodiment, the apparatus is operable to absorb heat from the first module 200A and the second module 200B through the first and second lateral edges 220A and 222B respectively. The heat may be dissipated through optional heat sinks (not shown). Optional heat sinks may comprise air flow deflectors.

In one embodiment, the apparatus further comprises a front bracket (not shown). The front bracket may be used for support, such as when the combined module 360 is injected/ejected in/out of the chassis 100. The front bracket may also enable the adapter to work in a high shock and vibration environment.

In one embodiment, the apparatus further comprises an EMC gasket (not shown), which may be used for Electromagnetic compatibility. The EMC gasket may also provide additional shielding and grounding functionality for the combined module 360 in the chassis 100.

In one embodiment, the apparatus is operable to provide a good grounding connection between the first module 200A, the second module 200B, and the chassis 100.

Numerous variations and modifications will become apparent to those skilled in art once the above disclosure is fully appreciated. It is intended that the following claims be interpreted to embrace all such variations and modifications.

What is claimed is:

1. An apparatus for coupling a first module to a second module, wherein the first module and the second module each comprises:
   a front face;
   a back face, opposite to the front face, wherein the back face comprises one or more connectors for coupling to a chassis;
   a first lateral edge, comprising a first keep-out region which extends at least a portion of the distance from the front face to the back face;
   a second lateral edge opposite to the first lateral edge, comprising a second keep-out region which extends at least a portion of the distance from the front face to the back face;
   wherein each of the first module and the second module has a first size;
   the apparatus comprising:
     a first plate;
     a second plate; and
     one or more coupling elements operable to couple the first plate to the second plate;
     wherein the first plate and the second plate each comprises a first lateral edge, and a second lateral edge opposite to the first lateral edge;
     wherein, in coupling the first plate to the second plate, the one or more coupling elements are operable to clamp the first keep-out region of the first module between the second lateral edge of the first plate and the second lateral edge of the second plate, and to clamp the second keep-out region of the second module between the first lateral edge of the first plate and the first lateral edge of the second plate, thereby coupling the first module to the second module to form a combined module of a second size; and
   wherein the combined module is operable to be inserted into a slot in the chassis, wherein the chassis comprises one or more slots each operable to receive a module of said second size.

2. The apparatus of claim 1,
wherein said first size comprises a first height, wherein said front face and said back face of said first module and said second module each has said first height;
wherein said second size comprises a second height; and
wherein said second height is at least twice said first height.

3. The apparatus of claim 2,
wherein said first height is approximately 3U, and wherein said second height is approximately 6U.

4. The apparatus of claim 1,
wherein the combined module comprises a back face, wherein the back face of the combined module comprises the back face of the first module and the back face of the second module.

5. The apparatus of claim 4, the apparatus further comprising:
a card alignment guide operable to physically removably connect to the back face of the first module and the second module to align the first module and the second module.

6. The apparatus of claim 5,
the card alignment guide further operable to be removed from the back face of the combined module after the apparatus has been fixedly coupled to the first and second modules.

7. The apparatus of claim 1,
wherein when the combined module is inserted into a slot in the chassis, the one or more connectors on each of the first and second modules are adapted to connect to corresponding connectors in the chassis.

8. The apparatus of claim 1,
wherein at least one of the first plate and the second plate further comprises an outside step-down region;
wherein, prior to said clamping, the outside step-down region is operable to provide guide rail functionality for the keep out region of each of said first module and said second module during coupling.

9. The apparatus of claim 1,
wherein at least one of the first plate and the second plate further comprises one or more mounting holes operable to couple with air flow deflectors.

10. A method for coupling a first module to a second module,
wherein the first module and the second module each comprises:
   a front face;
   a back face, opposite to the front face, wherein the back face comprises one or more connectors for coupling to a chassis;
   a first side;
   a second opposite side;
the method comprising:
   positioning a first plate to physically contact an upper portion of the first side of the first module and a lower portion of the first side of the second module; wherein the first plate has an interior side and an exterior side, wherein a lower portion of the interior side of the first plate is operable to contact the upper portion of the first side of the first module and wherein an upper portion of the interior side of the first plate is operable to contact the lower portion of the first side of the second module;
   positioning a second plate to physically contact an upper portion of the second side of the first module and a lower portion of the second side of the second module; wherein the second plate has an interior side and an exterior side, wherein a lower portion of the interior side of the second plate is operable to contact the upper portion of the second side of the first module and wherein an upper portion of the interior side of the second plate is operable to contact the lower portion of the second side of the second module;
   applying one or more coupling elements operable to couple the first plate to the second plate, wherein said applying operates to clamp the upper portions of the first and second sides of the first module between a lower portion of the first plate and a lower portion of the second plate, wherein said applying further operates to clamp the lower portions of the first and second sides of the second module between an upper portion of the first plate and an upper portion of the second plate, and wherein said applying further operates to clamp the first plate and the second plate together, thereby coupling the first module to the second module to form a combined module of a second size; and inserting the combined module into a slot in the chassis, wherein the chassis comprises one or more slots each operable to receive a module of said second size.

11. The method of claim 10,
wherein said first size comprises a first height, wherein said front face and said back face of said first module and said second module each has said first height;
wherein said second size comprises a second height; and
wherein said second height is at least twice said first height.

12. The method of claim 11,
wherein said first height is approximately 3U, and wherein said second height is approximately 6U.

13. The method of claim 10,
wherein the first module and the second module comprise at least one injector/ejector lever.

14. The method of claim 13, wherein said coupling a first module and a second module together further comprises:
coupling said adapter with the first module and the second module simultaneously.

15. The method of claim 13, wherein said coupling a first module and a second module together further comprises:
coupling said first plate to the injector/ejector lever of the second module.

16. The method of claim 13,
wherein the first plate comprises a handle element.

17. The method of claim 16, further comprising:
removing said injector/ejector lever from the second module.

18. The method of claim 10,
wherein the combined module comprises a back face, wherein the combined module comprises the back face of the first module and the back face of the second module.

19. The method of claim 18, further comprising:
coupling said handle element to the second module.

20. The method of claim 10, wherein said coupling a first module and a second module together further comprises:
physically removably connect a card alignment guide with the back face of the first module and the back face of the second module to align the first module and the second module.

21. The method of claim 20, further comprising:
removing the card alignment guide from the back face of the combined module after the first module and the second module have been fixedly coupled together.

22. The method of claim 10,
wherein at least one of the first plate and the second plate further comprises an outside step-down region;
wherein, prior to said clamping, the outside step-down region is operable to provide guide rail functionality for the keep out region of each of said first module and said second module during said coupling.

23. The method of claim 10,
wherein at least one of the first plate and the second plate further comprises one or more mounting holes operable to couple with air flow deflectors.

24. A method for coupling a first module to a second module,
wherein the first module and the second module each comprises:
a front face;
a back face, opposite to the front face, wherein the back face comprises one or more connectors for coupling to a chassis;
a first lateral edge, comprising a first keep-out region which extends at least a portion of the distance from the front face to the back face;
a second lateral edge opposite to the first lateral edge, comprising a second keep-out region which extends at least a portion of the distance from the front face to the back face;
wherein each of the first module and the second module has a first size; the method comprising:
providing a first plate, wherein the first plate comprises a first lateral edge, and a second lateral edge opposite to the first lateral edge;
providing a second plate; wherein the second plate comprises a first lateral edge, and a second lateral edge opposite to the first lateral edge;
coupling the first plate to the second plate using said one or more coupling elements to clamp the first keep-out region of the first module between the first lateral edge of the first plate and the first lateral edge of the second plate, and to clamp the second keep-out region of the second module between the second lateral edge of the first plate and the second lateral edge of the second plate, thereby coupling the first module to the second module to form a combined module of a second size;
inserting the combined module into a slot in the chassis, wherein the chassis comprises one or slots each operable to receive a module of said second size.

* * * * *

UNITED STATES PATENT AND TRADEMARK OFFICE
CERTIFICATE OF CORRECTION

PATENT NO. : 6,608,755 B2
DATED : August 19, 2003
INVENTOR(S) : Baldwin et al.

It is certified that error appears in the above-identified patent and that said Letters Patent is hereby corrected as shown below:

Column 10,
Line 35, please delete "said" between the words "second plate using" and "one".
Line 46, please insert -- more -- between the words "or" and "slots".

Signed and Sealed this

Twenty-third Day of December, 2003

JAMES E. ROGAN
*Director of the United States Patent and Trademark Office*